United States Patent
Kuramochi et al.

(10) Patent No.: US 8,569,192 B2
(45) Date of Patent: Oct. 29, 2013

(54) SINTERED COMPLEX OXIDE, METHOD FOR PRODUCING SINTERED COMPLEX OXIDE, SPUTTERING TARGET AND METHOD FOR PRODUCING THIN FILM

(75) Inventors: Hideto Kuramochi, Ayase (JP); Kenji Omi, Ayase (JP); Masanori Ichida, Ayase (JP); Hitoshi Iigusa, Ayase (JP)

(73) Assignee: Tosoh Corporation, Yamaguchi (JP)

( * ) Notice: Subject to any disclaimer, the term of this patent is extended or adjusted under 35 U.S.C. 154(b) by 336 days.

(21) Appl. No.: 13/003,626

(22) PCT Filed: Jul. 14, 2009

(86) PCT No.: PCT/JP2009/062739
§ 371 (c)(1),
(2), (4) Date: Mar. 10, 2011

(87) PCT Pub. No.: WO2010/007989
PCT Pub. Date: Jan. 21, 2010

(65) Prior Publication Data
US 2011/0155560 A1   Jun. 30, 2011

(30) Foreign Application Priority Data
Jul. 15, 2008  (JP) .............................. P2008-183461

(51) Int. Cl.
*C04B 35/453* (2006.01)
*H01B 1/08* (2006.01)
(52) U.S. Cl.
USPC ........ 501/126; 501/127; 501/134; 252/519.5; 252/519.51; 204/298.13

(58) Field of Classification Search
USPC .......... 501/126, 127, 134; 252/519.5, 519.51; 204/298.13
See application file for complete search history.

(56) References Cited

U.S. PATENT DOCUMENTS

| | | |
|---|---|---|
| 5,458,753 A | 10/1995 | Sato et al. |
| 2009/0197757 A1 | 8/2009 | Fukushima |
| 2010/0108502 A1* | 5/2010 | Inoue et al. ............... 204/298.13 |
| 2012/0118726 A1* | 5/2012 | Yano et al. ............... 204/192.25 |
| 2012/0228133 A1* | 9/2012 | Itose et al. ............... 204/298.13 |

FOREIGN PATENT DOCUMENTS

| | | |
|---|---|---|
| CN | 1633516 | 6/2005 |
| EP | 0354769 | 2/1990 |
| JP | 06-002130 | 1/1994 |
| JP | 6-25838 | 2/1994 |
| JP | 07-258836 | 10/1995 |

(Continued)

OTHER PUBLICATIONS

International Preliminary Report on Patentability for PCT/JP2009/062739, mailed Feb. 8, 2011.

(Continued)

*Primary Examiner* — Karl Group
(74) *Attorney, Agent, or Firm* — Greenblum & Bernstein, P.L.C.

(57) ABSTRACT

A sintered complex oxide comprising metal oxide particles (a) having a hexagonal lamellar structure and containing zinc oxide and indium, and metal oxide particles (b) having a spinel structure and containing a metal element M (where M is aluminum and/or gallium), wherein the mean value of the long diameter of the metal oxide particles (a) is no greater than 10 μm, and at least 20% of the metal oxide particles (a) have an aspect ratio (long diameter/short diameter) of 2 or greater, based on the number of particles.

6 Claims, 4 Drawing Sheets

(56) References Cited

FOREIGN PATENT DOCUMENTS

| | | |
|---|---|---|
| JP | 2805813 | 7/1998 |
| JP | 2004-175616 | 6/2004 |
| JP | 2006-200016 | 8/2006 |
| JP | 3864425 | 10/2006 |
| JP | 2008-63214 | 3/2008 |
| WO | 2007/034733 | 3/2007 |
| WO | 2007034733 | 3/2007 |
| WO | 2008/072486 A1 | 6/2008 |

OTHER PUBLICATIONS

International Search Report issued with respect to International Application No. PCT/JP2009/062739, dated Oct. 13, 2009.

* cited by examiner

SINTERED COMPLEX OXIDE, METHOD FOR PRODUCING SINTERED COMPLEX OXIDE, SPUTTERING TARGET AND METHOD FOR PRODUCING THIN FILM

TECHNICAL FIELD

The present invention relates to a sintered complex oxide, a method for producing a sintered complex oxide, a sputtering target and a method for producing a thin film.

BACKGROUND ART

Transparent conductive films have high transmittance and high conductivity in the visible light range, and are used in electrodes of liquid crystal display units or various light receiving elements such as solar cells, while they are also widely used in thermic ray reflective films or antistatic films for automobiles or construction materials, and anti-fogging transparent heating units in freezer showcases and the like.

Such transparent conductive films that are known include indium oxide films that contain tin as the dopant, indium oxide films that contain zinc as the dopant, and zinc oxide films that contain one or more elements of Group III of the Periodic Table as dopants.

Indium oxide films that contain tin as the dopant are known as ITO films, and they easily yield low resistance films. However, because the indium in ITO films is an expensive rare metal, there has been a limit to cost reduction when such films are used. Furthermore, because indium reserves are low and can only be obtained as a by-product of zinc mineral processing, it is currently difficult to achieve significant production increase and stable supply for ITO films.

Indium oxide films containing zinc as a dopant are known as IZO films and are films exhibiting excellent low resistance, but the problems associated with the indium starting material are the same as for ITO films.

Consequently, avid efforts are being made to develop a material for transparent conductive films as a substitute for ITO. Among them, zinc oxide films that comprise zinc oxide as the main component and contain elements of Group III of the Periodic Table, due to the very low cost of the main starting material zinc and the high abundance of its reserves and product, are raising interest as they do not entail concerns regarding resource depletion and stability of supply as with ITO films, while they are also inexpensive and chemically stable, and exhibit excellent transparency and conductivity as well (see Patent document 1, for example).

Incidentally, zinc oxide (ZnO) is an oxide semiconductor, and intrinsic defects such as oxygen vacancies, due to deviations from the stoichiometric composition, form a donor level such that n-type properties are exhibited. When the zinc oxide contains an element of Group III of the Periodic Table, the conduction electrons are increased and resistivity is reduced. As elements of Group III of the Periodic Table included in zinc oxide there are known aluminum (see Patent document 1 and Patent document 2, for example), gallium (see Patent document 3, for example) and boron (see Patent document 4, for example).

When known zinc oxide-based sputtering targets of the prior art are used as means for forming thin-films such as transparent conductive films, anomalous discharge that occurs during sputtering results in problems such as a reduced availability factor of the sputtering apparatus and lower product yield due to the effect of generated particles.

As means for inhibiting anomalous discharge generated during sputtering there has been proposed, in Patent document 1 for example, an inhibiting effect by high-densification of the sintered compacts through modification of the production method. It has also been shown that anomalous discharge can be further inhibited by, for example, densifying the sintered compact and limiting to no greater than 5 μm the aluminum component aggregation diameter attributed to the aluminum oxide that has been added as the oxide of an element of Group III of the Periodic Table (see Patent document 5).

It has additionally been shown that if the mean particle size of $ZnAl_2O_4$ particles composed of zinc oxide and the aluminum oxide additive is limited to no greater than 0.5 μm, anomalous discharge during sputtering is inhibited and the production yield of thin-films with improved humidity resistance is increased (see Patent document 6).

CITATION LIST

Patent Literature

[Patent document 1] Japanese Patent Publication No. 2805813
[Patent document 2] Japanese Unexamined Patent Application Publication HEI No. 6-2130
[Patent document 3] Japanese Unexamined Patent Application Publication HEI No. 6-25838
[Patent document 4] Japanese Unexamined Patent Application Publication No. 2004-175616
[Patent document 5] Japanese Patent Publication No. 3864425
[Patent document 6] Japanese Unexamined Patent Application Publication No. 2006-200016

SUMMARY OF INVENTION

Technical Problem

With conventional zinc oxide-based sputtering targets, however, it has been difficult to sufficiently reduce generation of anomalous discharge during sputtering. Anomalous discharge occurring during sputtering tends to cause fly-off of particles, reduce yields and lower thin-film productivity. It is therefore an object of the present invention to provide a sputtering target that can adequately inhibit generation of anomalous discharge, as well as a method for producing a thin film using the sputtering target. It is another object to provide a sintered complex oxide that can be used as such a sputtering target, and a method for producing it.

Solution to Problem

As a result of much diligent research in light of the problems mentioned above, the present inventors have found that by using a sintered complex oxide having a specific structure as the sputtering target, it is possible to notably inhibit anomalous discharge during sputtering, and the invention has been completed upon this finding.

Specifically, the invention provides a sintered complex oxide comprising metal oxide particles (a) having a hexagonal lamellar structure and containing zinc oxide and indium, and metal oxide particles (b) having a spinel structure and containing a metal element M (where M is aluminum and/or gallium), wherein the mean value of the long diameter of the metal oxide particles (a) is no greater than 10 μm, and at least 20% of the entire metal oxide particles (a) have an aspect ratio (long diameter/short diameter) of 2 or greater, based on the number of particles.

The maximum particle size of the metal oxide particles (b) is preferably no greater than 10 μm.

The sintered complex oxide preferably has an atomic ratio of 0.001-0.02 for indium with respect to the total of zinc, indium and the metal element M, and an atomic ratio of 0.005-0.05 for the metal element M with respect to the total.

The metal oxide particles (b) preferably contain $ZnM_2O_4$ as the major component. Also, the metal element M is preferably aluminum.

The invention further provides a method for producing a sintered complex oxide which comprises a first step in which zinc oxide powder and indium oxide powder are mixed to obtain a first mixed powder, a second step in which the first mixed powder is mixed with an oxide powder containing a metal element M (where M is aluminum and/or gallium) to obtain a second mixed powder, and a third step in which the second mixed powder is molded and fired to obtain a sintered complex oxide, wherein in the first step, the zinc oxide powder and indium oxide powder are mixed in such a manner that the BET value of the first mixed powder is at least 2 $m^2/g$ larger than the weighted average value of the BET value of the zinc oxide powder and indium oxide powder before mixing.

The sintered complex oxide obtained by the third step comprises metal oxide particles (a) having a hexagonal lamellar structure and containing zinc oxide and indium, and metal oxide particles (b) having a spinel structure and containing a metal element M (where M is aluminum and/or gallium), wherein the mean value of the long diameter of the metal oxide particles (a) is no greater than 10 μm, and at least 20% of the entire metal oxide particles (a) have an aspect ratio (long diameter/short diameter) of 2 or greater, based on the number of particles.

The second mixed powder preferably has an atomic ratio of 0.001-0.02 for indium with respect to the total of zinc, indium and the metal element M, and an atomic ratio of 0.005-0.05 for the metal element M with respect to the total. Also, the metal element M is preferably aluminum.

The invention further provides a sputtering target comprising the aforementioned sintered complex oxide.

The invention still further provides a method for producing a thin film that employs the aforementioned sputtering target.

Advantageous Effects of Invention

According to the invention there are provided a sintered complex oxide used as a sputtering target that can notably inhibit anomalous discharge during sputtering, a method for producing the sintered complex oxide, a sputtering target comprising the sintered complex oxide and a method for producing a thin film employing the sintered complex oxide.

DESCRIPTION OF EMBODIMENTS

Sintered Complex Oxide

The sintered complex oxide of this embodiment comprises metal oxide particles (a) having a hexagonal lamellar structure and containing zinc oxide and indium, and metal oxide particles (b) having a spinel structure and containing a metal element M (where M is aluminum and/or gallium). Also, the mean value of the long diameter of the metal oxide particles (a) is no greater than 10 μm, and at least 20% of the entire metal oxide particles (a) have an aspect ratio (long diameter/short diameter) of 2 or greater, based on the number of particles. With a sintered complex oxide having such a construction, it is possible to obtain a sputtering target that can notably reduce generation of anomalous discharge during sputtering. Also, by using the sputtering target for formation of a thin-film, it is possible to obtain a thin-film with minimal particle generation and high productivity.

In X-ray diffraction, the sintered complex oxide exhibits a diffraction pattern attributed to the hexagonal wurtzite form of the zinc oxide and a diffraction pattern attributed to a spinel structure. The former is thought to be the diffraction pattern derived from the metal oxide particles (a), while the latter is the diffraction pattern derived from the metal oxide particles (b).

Moreover, by analysis of the sintered complex oxide using a TEM/EDS (transmission electron microscope/energy dispersive X-ray analysis apparatus), SEM/EDS (scanning electron microscope/energy dispersive X-ray analysis apparatus), EPMA (X-ray microanalyzer) or SPM (scanning probe microscope), metal oxide particles (a) having a lamellar structure composed mainly of zinc oxide are observed. The presence of such metal oxide particles (a) with a lamellar structure is believed to be a factor allowing minimization of anomalous discharge during sputtering. Conventional zinc oxide used as a sputtering target may have a hexagonal wurtzite-form crystal structure, but none is known having a hexagonal wurtzite-form crystal structure and a lamellar structure.

Also, with analysis of the aforementioned sintered complex oxide by TEM/EDS, SEM/EDS or EPMA, metal oxide particles (b) having a spinel structure and containing a metal element M are observed.

The mean value of the long diameter of the metal oxide particles (a) in the sintered complex oxide can be measured by the following method. First, the sintered complex oxide is cut to an appropriate size and the observed side is subjected to surface polishing followed by chemical etching with a dilute acetic acid solution, to clarify the grain boundaries. Next, EPMA or SEM/EDS is used to take an observational photograph of the polished side of the sintered complex oxide, while confirming the composition of each particle. The obtained observational photograph is subjected to image processing with emphasis on the particles that are composed of zinc oxide and have a hexagonal lamellar structure (metal oxide particles (a)), and the long diameters of the particles are determined. The measurement is performed for at least 500 particles extracted at random, and the number average is recorded as the mean value for the long diameter of the metal oxide particles (a).

The mean value for the long diameter of the metal oxide particles (a) is preferably no greater than 8 μm and more preferably no greater than 7 μm. A sintered complex oxide having a mean value of no greater than 8 μm for the long diameter of the metal oxide particles (a) can yield a sputtering target capable of further inhibiting anomalous discharge.

The proportion of particles having an aspect ratio (long diameter/short diameter) of 2 or greater among the metal oxide particles (a) in the sintered complex oxide is at least 20% of the entire number of metal oxide particles (a), based on the number of particles. The aspect ratio can be determined by measuring the short diameter of the metal oxide particles (a), in the same manner as for measurement of the long diameter of the metal oxide particles (a), and performing calculation by the following formula (I).

$$\text{Aspect ratio} = \text{long diameter/short diameter} \qquad (I)$$

The proportion of metal oxide particles (a) having an aspect ratio of 2 or greater can be determined as the ratio of the number of metal oxide particles (a) having an aspect ratio of 2 or greater with respect to the total number of metal oxide particles (a) whose long diameter and short diameter were measured. The proportion of particles having an aspect ratio of 2 or greater is preferably at least 40% and more preferably at least 50%. A sputtering target composed of such a sintered complex oxide can further inhibit anomalous discharge.

The metal oxide particles (a) are particles comprising indium and having a hexagonal lamellar structure composed of zinc oxide, and they may be particles with a proportion of at least 20% of particles with a mean long diameter of no greater than 10 μm and an aspect ratio (long diameter/short diameter) of 2 or greater, based on the number of particles. That is, the metal oxide particles (a) may be particles containing indium in zinc oxide with a primarily hexagonal lamellar structure.

The metal oxide particles (b) are particles containing a metal element M (where M is aluminum and/or gallium), and having a spinel structure.

The maximum size of the metal oxide particles (b) is preferably no greater than 10 μm, more preferably no greater than 5 μm and even more preferably no greater than 3 μm. This can further inhibit anomalous discharge. The maximum size of the metal oxide particles (b) is determined as the maximum value from measurement of the particle sizes of 500 metal oxide particles (b) in the same manner as for measurement of the long diameter of the metal oxide particles (a).

The mean particle size of the metal oxide particles (b) is determined as the number average from measurement of the particle sizes of 500 metal oxide particles (b) in the same manner as for measurement of the long diameter of the metal oxide particles (a). The mean particle size of the metal oxide particles (b) is preferably no greater than 2 μm, and more preferably no greater than 1 μm.

The metal element M represents aluminum and/or gallium, with aluminum being most preferably used. The reason is that aluminum has satisfactory handleability, lower raw material cost and superior productivity. When the metal element M is aluminum, the metal oxide particles (b) are preferably represented mainly by $ZnAl_2O_4$.

The metal oxide particles (b) are preferably represented mainly by $ZnM_2O_4$ (where M is aluminum and/or gallium). By including such metal oxide particles (b), the conductivity of the sintered complex oxide is improved and the aforementioned anomalous discharge is further inhibited. The phrase "represented mainly by $ZnM_2O_4$" means that when the sintered complex oxide comprising the metal oxide particles (b) is evaluated by X-ray diffraction (XRD), it exhibits the peak pattern for $ZnM_2O_4$ (for example, $ZnAl_2O_4$ in the case of Al) in the JCPDS (Joint Committee on Powder Diffraction Standards) database, or a similar peak pattern (shifted peak pattern).

For the sintered complex oxide described above, the atomic ratio of indium with respect to the total zinc, indium and metal element M in the sintered complex oxide is preferably 0.001-0.02, more preferably 0.001-0.01 and even more preferably 0.002-0.01. If the indium content is within this range, the resistivity of thin-films obtained using a sputtering target composed of the sintered complex oxide will tend to be reduced and the heat resistance or humidity resistance improved.

The atomic ratio of the metal element M with respect to the total of the zinc, indium and metal element M in the sintered complex oxide is preferably 0.005-0.05, more preferably 0.005-0.04 and even more preferably 0.01-0.04. If the metal element M content is within this range, the resistivity of thin-films obtained using a sputtering target composed of the sintered complex oxide will be reduced, rendering them particularly suitable as thin-films for purposes including electrodes of various display devices such as liquid crystal devices or various light receiving elements such as solar cells.

The preferred contents for indium and the metal element M in the sintered complex oxide may be represented by the following equations (II) and (III). Specifically, the metal element composing the sintered complex oxide preferably satisfies the following equations (II) and (III) in terms of atomic ratio.

$$In/(Zn+M+In)=0.001-0.02 \qquad (II)$$

$$M/(Zn+M+In)=0.005-0.05 \qquad (III)$$

Furthermore, in a sintered complex oxide satisfying equations (II) and (III), the metal oxide particles (b) are preferably particles composed mainly of $ZnM_2O_4$. Such a construction improves the conductivity of the sintered complex oxide and can further inhibit the aforementioned anomalous discharge. In addition, the obtained thin-films have low resistance and excellent heat resistance and humidity resistance.

Preferred among such compositions are those satisfying the following equations (IV) and (V).

$$In/(Zn+M+In)=0.001-0.01 \qquad (IV)$$

$$M/(Zn+M+In)=0.005-0.04 \qquad (V)$$

The sintered complex oxide may contain an element other than zinc, indium and the metal element M, examples of which include Ti, Zr, Si, Ge, Sn, V, Cr and W. The contents of such elements are preferably no greater than 0.05 and more preferably no greater than 0.02, with respect to 1 as the total moles of zinc, indium and the metal element M.

The sintered complex oxide may contain particles other than the metal oxide particles (a) and metal oxide particles (b), but it is preferably a sintered complex oxide composed essentially of the metal oxide particles (a) and metal oxide particles (b). The total mass of the metal oxide particles (a) and metal oxide particles (b) is preferably at least 90%, more preferably at least 95% and even more preferably at least 98%, based on the total mass of the sintered complex oxide. Such a sintered complex oxide can more satisfactorily exhibit the effect of the invention.

(Method for Producing Sintered Complex Oxide)

The method for producing a sintered complex oxide according to this embodiment comprises a first step in which zinc oxide powder and indium oxide powder are pre-mixed to obtain a first mixed powder, a second step in which the first mixed powder is mixed with an oxide powder containing a metal element M (where M is aluminum and/or gallium) to obtain a second mixed powder, and a third step in which the second mixed powder is molded and fired to obtain a sintered complex oxide, wherein in the first step, the mixing is carried out in such a manner that the BET value of the first mixed powder is at least 2 $m^2/g$ larger than the weighted average value of the BET value of the zinc oxide powder and indium oxide powder before mixing. The sintered complex oxide described above can be efficiently produced by this production method.

There are no particular restrictions on the zinc oxide powder, indium oxide powder and metal element M oxide powder used as starting materials, but it is preferred to use powders with a BET value of 2-20 m$^2$/g. In particular, the indium oxide powder and metal element M oxide powder preferably have BET values of 10-20 m$^2$/g, from the standpoint of bulk and handleability of the powders.

The amounts of zinc oxide powder, indium oxide powder and metal element M oxide powder used preferably satisfy the following equations (VI) and (VII), in terms of the atomic ratios of the metal elements. Also, M is preferably aluminum.

$$In/(Zn+M+In)=0.001-0.02 \quad (VI)$$

$$M/(Zn+M+In)=0.005-0.05 \quad (VII)$$

The mixing method in the first step is not particularly restricted, and examples include mixing methods such as dry or wet media stirrer mill mixing using balls or beads of zirconia, alumina, nylon resin or the like; medialess container rotational mixing and mechanical stir mixing. More specifically, there may be used a ball mill, bead mill, attritor, vibrating mill, planetary mill, jet mill, V-shaped mixer, paddle mixer, biaxial planetary stirring mixer, or the like. Crushing is carried out simultaneously with mixing in the first step, and the crushed powder particle size is preferably as fine as possible, with the BET value of the first mixed powder being preferably 5 m$^2$/g or greater. When a wet ball mill or bead mill, attritor, vibrating mill, planetary mill, jet mill or the like is used, the crushed slurry must be dried. The drying method is not particularly restricted, and examples include filtration drying, fluidized bed drying and spray-drying.

The first mixed powder is preferably calcined before being supplied to the second step. The temperature during this time is preferably 600-1200° C., and a time of 1-3 hours is sufficient. This will further facilitate obtaining a microstructure for the sintered complex oxide, and can further reduce the maximum particle size of the spinel structure particles.

In the second step, the first mixed powder is mixed with oxide powder containing the metal element M to obtain a second mixed powder. There are no particular restrictions on the mixing method at this point, and the same method may be used as for pre-mixing in the first step. The mixing is preferably carried out in such a manner that the BET value of the second mixed powder is at least 2 m$^2$/g larger than the BET value of the first mixed powder. This will further facilitate obtaining a microstructure for the sintered complex oxide, and can further reduce the maximum particle size of the metal oxide particles (b) having a spinel structure.

The second mixed powder preferably has an atomic ratio of 0.001-0.02 for indium with respect to the total of zinc, indium and the metal element M. The second mixed powder also preferably has an atomic ratio of 0.005-0.05 for the metal element M with respect to the total of zinc, indium and the metal element M. Such a content ratio will allow efficient production of a sintered complex oxide with the optimal compositional ratio.

Next, in third step, the second mixed powder is molded and fired to obtain a sintered complex oxide. The molding method is not particularly restricted, except that it is essential for the molding method to be appropriately selected to allow molding to the desired shape. Examples of molding methods include press molding and cast molding. The molding pressure is not particularly restricted so long as it is a molding pressure that does not generate cracks and produces a manageable compact. The molding density of the compact is preferably as high as possible. A method such as cold isostatic pressure (CIP) molding may be employed to obtain a compact with high molding density.

In the third step, the firing temperature is preferably 800-1600° C. Such a firing temperature will allow the sintered complex oxide microstructure to be more satisfactorily obtained. The firing temperature is more preferably 1100-1500° C. Such a firing temperature will inhibit the characteristic volatilization loss of the zinc oxide-based complex oxide and allow the sintered density to be relatively increased. From the viewpoint of handling and preventing damage during sputtering, the sintered density is preferably 4.7 g/cm$^3$ or greater. The firing time is not particularly restricted but will normally be 1-48 hours, and from the viewpoint of the effect on productivity it is preferably 3-24 hours.

The temperature-elevating rate during firing is not particularly restricted, but when firing is carried out in a temperature range of 800° C. or higher, it is preferably no greater than 50° C./hr. This is to efficiently form the metal oxide particles (a) and metal oxide particles (b) and further increase the homogeneity of the sintered complex oxide. The firing atmosphere is also not particularly restricted, and may be appropriately selected, for example, from among air, oxygen and inert gas atmospheres. The pressure during firing is also not particularly restricted, and firing may be carried out at ordinary pressure or under pressure or reduced pressure. Firing can also be accomplished by HIP or hot press sintering.

The relative density of the sintered complex oxide obtained in this manner is preferably 85% or greater, more preferably 90% or greater and even more preferably 96% or greater. Increasing the relative density can further inhibit generation of anomalous discharge.

Specifically, in the production method of this embodiment, zinc oxide powder and indium oxide powder are pre-mixed to a BET value of at least 2 m$^2$/g larger than before mixing, an oxide powder of a metal element M (where M is aluminum and/or gallium) is further mixed therewith, and the obtained mixed powder is molded and fired to produce a sintered complex oxide.

(Sputtering Target)

The sputtering target for this embodiment is composed of the aforementioned sintered complex oxide, and for example, it may be produced by working the sintered complex oxide to the desired shape. Such a sputtering target allows anomalous discharge during sputtering to be inhibited, and permits production of a metal oxide thin-film with high productivity.

(Method for Producing Thin Film)

The method for producing a thin film according to this embodiment employs the aforementioned sintered complex oxide as the sputtering target. When a conventional sputtering target is used, anomalous discharge has been considerable and it has been difficult to obtain thin-films with high productivity. According to the production method of this embodiment, however, it is possible to adequately inhibit anomalous discharge and obtain a thin-film with high productivity.

The thin-film is preferably formed by a sputtering method employing the sputtering target. The sputtering method may be appropriately selected from among DC sputtering methods, RF sputtering methods, DC magnetron sputtering methods, RF magnetron sputtering methods and ion beam sputtering methods.

The obtained thin-film is a thin-film comprising metal oxides, and the thin-film has high light transmittance and high conductivity and can be suitably used, for example, as an electrode for liquid crystal display units and various light receiving elements such as solar cells.

The embodiments described above are preferred embodiments of the invention, but the invention is not limited thereto.

EXAMPLES

The present invention will now be explained in greater detail through the following examples, with the understanding that the invention is in no way limited to the examples.

Example 1

A mixed powder was obtained by pre-mixing indium oxide powder having a BET value of 10 m²/g and a purity of 99.99%, with zinc oxide powder having a BET value of 4 m²/g and a purity of 99.8%, using a wet ball mill. The BET value of the mixed powder was 2.0 m²/g larger than the weighted average value for the BET values of the indium oxide powder and zinc oxide powder before mixing.

The obtained mixed powder was mixed with aluminum oxide powder having a BET value of 14 m²/g and a purity of 99.99%, using a wet ball mill, to prepare a slurry which was spray-dried to obtain dry powder 1. The composition of the dry powder 1 was as shown in Table 1. In Table 1 and Table 2, the In amounts are represented as the atomic ratio of indium with respect to the total of zinc, indium and the metal element M (that is, the calculated value of In/(Zn+M+In)). The amount of M is represented as the atomic ratio of the metal element M with respect to the total of zinc, indium and the metal element M (that is, the calculated value of M/(Zn+M+In)).

The dry powder 1 was CIP molded at 3.0 ton/cm², to obtain a disk-shaped compact with a diameter of 150 mm and a thickness of 12 mm. The compact was fired for 60 hours in a nitrogen atmosphere at a temperature of 1500° C., to obtain a sintered complex oxide. The physical properties of the sintered complex oxide are shown in Table 1.

The obtained sintered complex oxide was analyzed by XRD, TEM/EDS, SEM/EDS, EPMA and SPM. The products in which metal oxide particles (a) were observed having a hexagonal lamellar structure and containing zinc oxide and indium, as a result of each analysis, were evaluated as "A", and those wherein they were not observed were evaluated as "B". Also, those wherein metal oxide particles (b) were observed having a spinel structure and composed mainly of ZnM₂O₄ containing a metal element M (Al) were evaluated as "A", and those wherein they were not observed were evaluated as "B". The particle sizes of the metal oxide particles (a) and (b) were determined by the methods described above. The results are summarized in Table 1.

The obtained sintered complex oxide was worked into a 4-inch φ size to prepare a sputtering target, and a sputtering evaluation was conducted. The sputtering was carried out using a DC magnetron sputtering apparatus, under conditions with a substrate temperature of 200° C., an ultimate vacuum of 5×10⁻⁵ Pa, a sputtering gas of Ar, a sputtering gas pressure of 0.5 Pa and a DC power of 300 W. The discharge characteristic was evaluated as "A" when the number of anomalous discharges generated per unit time was at least 1 and less than 100 times/hr, and as "B" when it was at least 100 times/hr. The evaluation results are shown in Table 1.

Comparative Example 1

A mixed powder was obtained by mixing aluminum oxide powder having a BET value of 14 m²/g and a purity of 99.99%, with zinc oxide powder having a BET value of 4 m²/g and a purity of 99.8%, using a dry ball mill, to the composition shown in Table 1. The BET value of the mixed powder was 1.4 m²/g larger than the weighted average value for the BET values of the aluminum oxide powder and zinc oxide powder before mixing.

The obtained mixed powder was CIP molded at 3.0 ton/cm², to obtain a disk-shaped compact with a diameter of 150 mm and a thickness of 12 mm. The compact was fired for 5 hours in an argon atmosphere at a temperature of 1400° C., to obtain a sintered compact. The physical properties of the sintered compact are shown in Table 1. The sintered compact was worked into a 4-inch φ size as a target, and a sputtering evaluation was conducted in the same manner as Example 1. The results are shown in Table 1.

TABLE 1

| | M element | In amount (atomic ratio) | M amount (atomic ratio) | Sintered density (g/cm³) | Relative density (%) | Metal oxide particles (a) | Metal oxide particles (b) | Mean value of long diameter (μm) | Proportion with aspect ratio of ≥2 (%) | Spinel maximum particle size (μm) | Spinel mean particle size (μm) | Discharge property |
|---|---|---|---|---|---|---|---|---|---|---|---|---|
| Example 1 | Al | 0.0025 | 0.02 | 5.62 | 99.8 | A | A | 8.9 | 72 | 18.0 | 1.2 | A |
| Comp. Ex. 1 | Al | 0.0025 | 0.02 | 5.61 | 99.8 | A | A | 7.3 | 12 | 15.8 | 1.2 | B |

As seen in Table 1, using a sputtering target composed of the sintered complex oxide of Example 1 allowed anomalous discharge during film formation to be inhibited.

Example 2

A slurry 1 was prepared by pre-mixing indium oxide powder having a BET value of 10 m²/g and a purity of 99.99%, with zinc oxide powder having a BET value of 4 m²/g and a purity of 99.8%, using a wet ball mill. A portion of the slurry 1 was dried, and the BET value was measured and found to be 2.3 m²/g larger than the weighted average value for the BET values of the indium oxide powder and zinc oxide powder before mixing.

With the obtained slurry 1 there was then mixed aluminum oxide powder having a BET value of 14 m²/g and a purity of 99.99%, using a wet ball mill, to prepare a slurry 2 which was spray-dried to obtain dry powder 1. The composition of the dry powder 1 was as listed in Table 2. The dry powder 1 was CIP molded at 3.0 ton/cm², to obtain a disk-shaped compact with a diameter of 150 mm and a thickness of 12 mm. The compact was fired for 5 hours in a nitrogen atmosphere at a temperature of 1200° C., to obtain a sintered complex oxide.

The obtained sintered complex oxide was analyzed by XRD, TEM/EDS, SEM/EDS, EPMA and SPM. The products in which metal oxide particles (a) were observed having a hexagonal lamellar structure and containing zinc oxide and indium, as a result of each analysis, were evaluated as "A", and those wherein they were not observed were evaluated as "B". Also, those wherein metal oxide particles (b) were observed having a spinel structure and composed mainly of ZnM₂O₄ containing a metal element M (Al) were evaluated as "A", and those wherein they were not observed were evaluated as "B". The particle sizes of the metal oxide particles (a) and (b) were determined by the methods described above. The results are summarized in Table 2.

The obtained sintered complex oxide was worked into a 4-inch φ size to prepare a sputtering target, and a sputtering evaluation was conducted. The sputtering was carried out using a DC magnetron sputtering apparatus, under conditions with a substrate temperature of 200° C., an ultimate vacuum of $5 \times 10^{-5}$ Pa, a sputtering gas of Ar, a sputtering gas pressure of 0.5 Pa and a DC power of 300 W. The discharge characteristic was evaluated as "A'" when the number of anomalous discharges generated per unit time was less than 1 time/hr, as "B'" when it was 1 to less than 100 times/hr, as "C'" when it was 100 to less than 1000 times/hr, and "D'" when it was at least 1000 times/hr. The evaluation results are shown in Table 2.

Example 3

A slurry 1 was prepared by pre-mixing indium oxide powder having a BET value of 10 m²/g and a purity of 99.99%, with zinc oxide powder having a BET value of 4 m²/g and a purity of 99.8%, using a wet ball mill. A portion of the prepared slurry 1 was dried, and the BET value was measured and found to be 2.2 m²/g larger than the weighted average value for the BET values of the indium oxide powder and zinc oxide powder before mixing.

With the obtained slurry 1 there was then mixed aluminum oxide powder having a BET value of 14 m²/g and a purity of 99.99%, using a wet bead mill, to prepare a slurry 2 which was spray-dried to obtain dry powder 1. The composition of the dry powder 1 was as listed in Table 2. The dry powder 1 was CIP molded at 3.0 ton/cm², to obtain a disk-shaped compact with a diameter of 150 mm and a thickness of 12 mm. The compact was fired for 5 hours in a nitrogen atmosphere at a temperature of 1500° C., to obtain a sintered complex oxide. The obtained sintered complex oxide was evaluated in the same manner as Example 2. The evaluation results were as shown in Table 2.

The sintered complex oxide was worked into a 4-inch γ size as a target, and a sputtering evaluation was conducted in the same manner as Example 2. The evaluation results were as shown in Table 2.

Example 4

A slurry 1 was prepared by pre-mixing indium oxide powder having a BET value of 10 m²/g and a purity of 99.99%, with zinc oxide powder having a BET value of 4 m²/g and a purity of 99.8%, using a wet bead mill. The slurry 1 was dried to obtain dry powder 1. The BET value of the dry powder 1 was measured to be 2.8 m²/g larger than the weighted average value for the BET values of the indium oxide powder and zinc oxide powder before mixing.

The obtained dry powder 1 was then calcined at 1100° C. for 4 hours. With the obtained calcined powder there was then mixed aluminum oxide powder having a BET value of 14 m²/g and a purity of 99.99%, using a wet bead mill, to prepare a slurry 2. The slurry 2 was dried to obtain a dry powder 2. The BET value of the dry powder 2 was measured to be 2.1 m²/g larger than the BET value of the dry powder 1 before mixing. The composition of the dry powder 2 was as listed in Table 2.

The obtained dry powder 2 was CIP molded at 3.0 ton/cm², to obtain a disk-shaped compact with a diameter of 150 mm and a thickness of 12 mm. The compact was fired for 12 hours in an air atmosphere at a temperature of 1400° C. to obtain a sintered complex oxide. The obtained sintered complex oxide was evaluated in the same manner as Example 2. The evaluation results were as shown in Table 2.

The sintered complex oxide was worked into a 4-inch φ size as a target, and a sputtering evaluation was conducted in the same manner as Example 2. The evaluation results were as shown in Table 2.

Example 5

A mixed powder 1 was obtained by pre-mixing indium oxide powder having a BET value of 10 m²/g and a purity of 99.99%, with zinc oxide powder having a BET value of 4 m²/g and a purity of 99.8%, using a dry ball mill. The BET value of the mixed powder 1 was measured to be 2.0 m²/g larger than the weighted average value for the BET values of the indium oxide powder and zinc oxide powder before mixing.

With the obtained mixed powder 1 there was then mixed aluminum oxide powder having a BET value of 14 m²/g and a purity of 99.99%, using a dry ball mill, to obtain a mixed powder 2. The composition of the mixed powder 2 was as listed in Table 2. The obtained mixed powder 2 was CIP molded at 3.0 ton/cm², to obtain a disk-shaped compact with a diameter of 150 mm and a thickness of 12 mm. The compact was fired for 12 hours in a nitrogen atmosphere at a temperature of 1400° C., to obtain a sintered complex oxide. The obtained sintered complex oxide was evaluated in the same manner as Example 2. The evaluation results were as shown in Table 2.

The sintered complex oxide was worked into a 4-inch φ size as a target, and a sputtering evaluation was conducted in the same manner as Example 2. The evaluation results were as shown in Table 2.

Example 6

A slurry 1 was obtained by pre-mixing indium oxide powder having a BET value of 10 m²/g and a purity of 99.99%, with zinc oxide powder having a BET value of 4 m²/g and a purity of 99.8%, using a wet bead mill. The slurry 1 was dried to obtain a dry powder 1. The BET value of the dry powder 1 was measured to be 3.0 m²/g larger than the weighted average value for the BET values of the indium oxide powder and zinc oxide powder before mixing.

The obtained dry powder 1 was then calcined for 5 hours at a temperature of 1200° C. and the calcined powder was mixed with aluminum oxide powder having a BET value of 14 m²/g and a purity of 99.99%, using a wet bead mill, to prepare a slurry 2. The slurry 2 was spray-dried to obtain a dry powder 2. The BET value of the dry powder 2 was measured to be 2.0 m²/g larger than the dry powder 1. The composition of the dry powder 2 was as listed in Table 2.

The dry powder 2 was CIP molded at 3.0 ton/cm², to obtain a disk-shaped compact with a diameter of 150 mm and a thickness of 12 mm. The compact was fired for 5 hours in a nitrogen atmosphere at a temperature of 1400° C., to obtain a sintered complex oxide. The obtained sintered complex oxide was evaluated in the same manner as Example 2 The evaluation results were as shown in Table 2.

The sintered complex oxide was worked into a 4-inch φ size as a target, and a sputtering evaluation was conducted in the same manner as Example 2. The evaluation results were as shown in Table 2.

Example 7

A mixed powder 1 was obtained by pre-mixing indium oxide powder having a BET value of 10 m²/g and a purity of 99.99%, with zinc oxide powder having a BET value of 4 m²/g and a purity of 99.8%, using a dry ball mill. The BET value of the mixed powder 1 was measured to be 2.1 m²/g larger than the weighted average value for the BET values of the indium oxide powder and zinc oxide powder before mixing.

With the obtained mixed powder 1 there was then mixed aluminum oxide powder having a BET value of 14 m²/g and a purity of 99.99%, using a wet bead mill, to obtain slurry 1. The composition of the slurry 1 was as listed in Table 2. The obtained slurry 1 was spray-dried and then CIP molded at 3.0 ton/cm², to obtain a disk-shaped compact with a diameter of 150 mm and a thickness of 12 mm. The compact was fired for 5 hours in a nitrogen atmosphere at a temperature of 1100° C., to obtain a sintered complex oxide. The obtained sintered complex oxide was evaluated in the same manner as Example 2. The evaluation results were as shown in Table 2.

The sintered complex oxide was worked into a 4-inch ϕ size as a target, and a sputtering evaluation was conducted in the same manner as Example 2. The evaluation results were as shown in Table 2.

Example 8

A slurry 1 was obtained by pre-mixing indium oxide powder having a BET value of 10 m²/g and a purity of 99.99%, with zinc oxide powder having a BET value of 4 m²/g and a purity of 99.8%, using a wet ball mill. A portion of the slurry 1 was dried, and the BET value was measured and found to be 2.2 m²/g larger compared to the weighted average value for the BET values of the indium oxide powder and zinc oxide powder before mixing.

With the obtained slurry 1 there was then mixed gallium oxide powder having a BET value of 8 m²/g and a purity of 99.99%, using a wet ball mill, to prepare a slurry 2 which was spray-dried to obtain a dry powder 1. The composition of the dry powder 1 was as listed in Table 2. The dry powder 1 was CIP molded at 3.0 ton/cm², to obtain a disk-shaped compact with a diameter of 150 mm and a thickness of 12 mm. The compact was fired for 5 hours in a nitrogen atmosphere at a temperature of 1400° C., to obtain a sintered complex oxide. The properties of the obtained sintered complex oxide were evaluated in the same manner as Example 2. The evaluation results were as shown in Table 2.

The sintered complex oxide was worked into a 4-inch ϕ size as a target, and a sputtering evaluation was conducted in the same manner as Example 2. The evaluation results were as shown in Table 2.

Comparative Example 2

A slurry was obtained by mixing aluminum oxide powder having a BET value of 14 m²/g and a purity of 99.99%, with zinc oxide powder having a BET value of 4 m²/g and a purity of 99.8%, using a wet ball mill. The slurry was spray-dried to obtain a dry powder. The BET value of the dry powder was measured to be 2.3 m²/g larger than the weighted average value for the BET values of the indium oxide powder and zinc oxide powder before mixing. The composition of the dry powder was as listed in Table 2.

The obtained dry powder was then CIP molded at 3.0 ton/cm², to obtain a disk-shaped compact with a diameter of 150 mm and a thickness of 12 mm. The compact was fired for 5 hours in an argon atmosphere at a temperature of 1400° C., to obtain a sintered compact. The obtained sintered compact was evaluated in the same manner as Example 2. The evaluation results were as shown in Table 2.

The sintered compact was worked into a 4-inch ϕ size as a target, and a sputtering evaluation was conducted in the same manner as Example 2. The evaluation results were as shown in Table 2.

Comparative Example 3

A mixed powder 1 was obtained by pre-mixing indium oxide powder having a BET value of 10 m²/g and a purity of 99.99%, with zinc oxide powder having a BET value of 4 m²/g and a purity of 99.8%, using a dry ball mill. The BET value of the mixed powder 1 was measured to be 1.0 m²/g larger than the weighted average value for the BET values of the indium oxide powder and zinc oxide powder before mixing.

With the obtained mixed powder 1 there was then mixed aluminum oxide powder having a BET value of 14 m²/g and a purity of 99.99%, using a dry ball mill, to obtain a mixed powder 2. The composition of the mixed powder 2 was as listed in Table 2. The obtained mixed powder 2 was CIP molded at 3.0 ton/cm², to obtain a disk-shaped compact with a diameter of 150 mm and a thickness of 12 mm. The compact was fired for 5 hours in a nitrogen atmosphere at a temperature of 900° C., to obtain a sintered compact. The obtained sintered compact was evaluated in the same manner as Example 2. The evaluation results were as shown in Table 2.

The sintered compact was worked into a 4-inch ϕ size as a target, and a sputtering evaluation was conducted in the same manner as Example 2. The evaluation results were as shown in Table 2.

Comparative Example 4

A slurry 1 was prepared by pre-mixing indium oxide powder having a BET value of 10 m²/g and a purity of 99.99%, with zinc oxide powder having a BET value of 4 m²/g and a purity of 99.8%, using a wet ball mill. A portion of the slurry 1 was dried, and the BET value was measured and found to be 1.5 m²/g larger than the weighted average value for the BET values of the indium oxide powder and zinc oxide powder before mixing.

With the obtained slurry 1 there was then mixed aluminum oxide powder having a BET value of 14 m²/g and a purity of 99.99%, using a wet ball mill, to prepare a slurry 2. The slurry 2 was spray-dried to obtain a dry powder 1. The composition of the dry powder 1 was as listed in Table 2.

The dry powder 1 was CIP molded at 3.0 ton/cm², to obtain a disk-shaped compact with a diameter of 150 mm and a thickness of 12 mm. The compact was fired for 12 hours in a nitrogen atmosphere at a temperature of 1600° C., to obtain a sintered compact. The obtained sintered compact was evaluated in the same manner as Example 2. The evaluation results were as shown in Table 2.

The sintered compact was worked into a 4-inch ϕ size as a target, and a sputtering evaluation was conducted in the same manner as Example 2. The evaluation results were as shown in Table 2.

Comparative Example 5

A slurry 1 was obtained by pre-mixing indium oxide powder having a BET value of 10 m²/g and a purity of 99.99%, with zinc oxide powder having a BET value of 4 m²/g and a purity of 99.8%, using a wet ball mill. A portion of the slurry 1 was dried, and the BET value was measured and found to be 1.3 m²/g larger than the weighted average value for the BET values of the indium oxide powder and zinc oxide powder before mixing.

With the obtained slurry 1 there was then mixed aluminum oxide powder having a BET value of 14 m²/g and a purity of 99.99%, using a wet ball mill, to prepare a slurry 2 which was spray-dried to obtain a dry powder 1. The BET value of the obtained dry powder 1 was measured to be 1.2 m²/g larger than the BET value measured after drying a portion of the slurry 1. The composition of the dry powder 1 was as listed in Table 2. The obtained dry powder 1 was CIP molded at 3.0 ton/cm², to obtain a disk-shaped compact with a diameter of 150 mm and a thickness of 12 mm. The compact was fired for 5 hours in a nitrogen atmosphere at a temperature of 1400° C., to obtain a sintered compact. The obtained sintered compact was evaluated in the same manner as Example 2. The evaluation results were as shown in Table 2.

The sintered compact was worked into a 4-inch φ size as a target, and a sputtering evaluation was conducted in the same manner as Example 2. The evaluation results were as shown in Table 2.

Comparative Example 6

A slurry was prepared by mixing indium oxide powder having a BET value of 10 m²/g and a purity of 99.99%, zinc oxide powder having a BET value of 3 m²/g and a purity of 99.8% and aluminum oxide powder having a BET value of 14 m²/g and a purity of 99.99%, using a wet ball mill. The slurry was spray-dried to obtain a dry powder. The BET value of the dry powder was measured to be 2.1 m²/g larger than the weighted average value for the BET values of the indium oxide powder, zinc oxide powder and aluminum oxide powder before mixing. The composition of the dry powder was as listed in Table 2.

The obtained dry powder was then CIP molded at 3.0 ton/cm², to obtain a disk-shaped compact with a diameter of 150 mm and a thickness of 12 mm. The compact was fired for 5 hours in a nitrogen atmosphere at a temperature of 1000° C., to obtain a sintered compact.

The obtained sintered compact was evaluated in the same manner as Example 2. The evaluation results were as shown in Table 2.

The sintered compact was worked into a 4-inch φ size as a target, and a sputtering evaluation was conducted in the same manner as Example 2. The evaluation results were as shown in Table 2.

Figure 1:
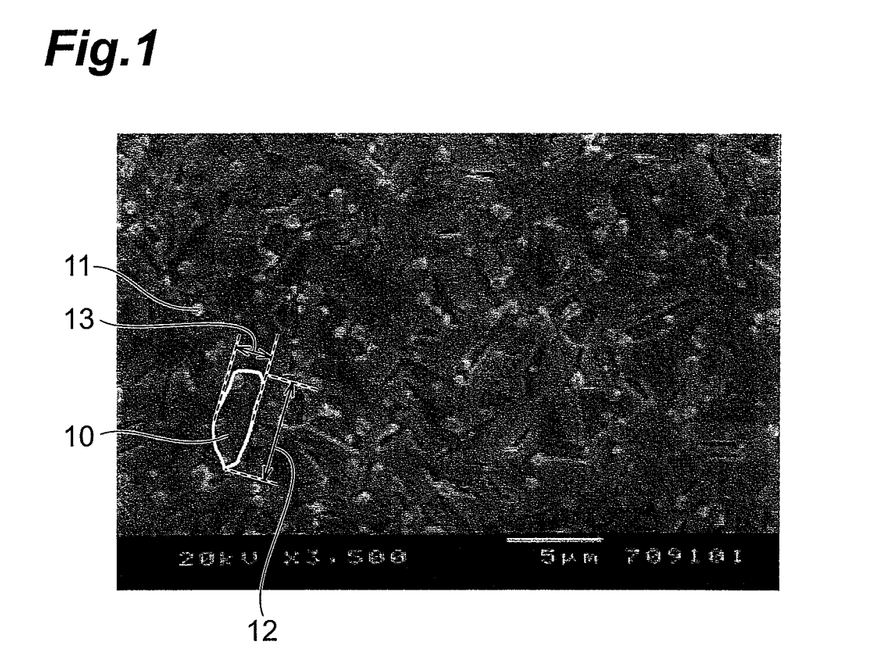
FIG. 1 is an SEM photograph showing a cross-section of the sintered complex oxide of Example 3.
Figure 2:
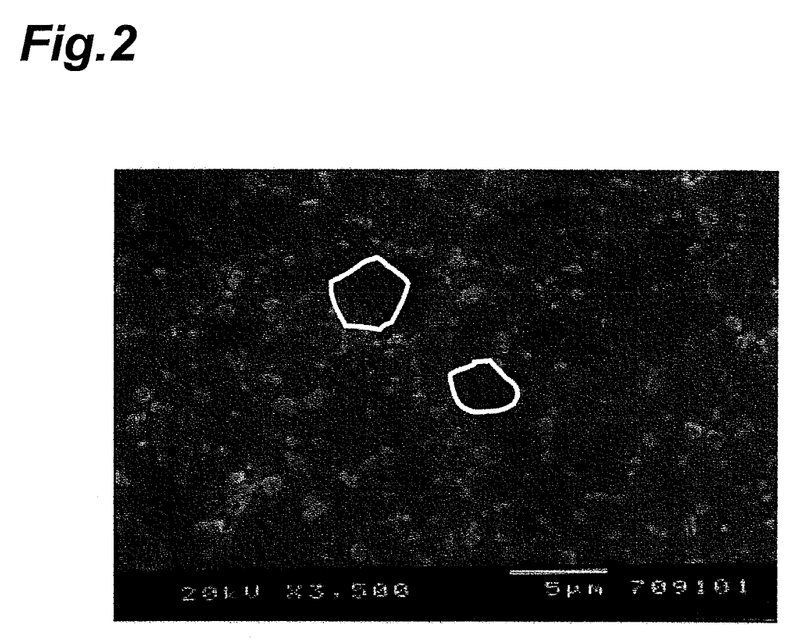
FIG. 2 is an SEM photograph showing a cross-section of the sintered compact obtained in Comparative Example 2.

FIG. 1 is an SEM photograph showing a cross-section of the sintered complex oxide of Example 3. In FIG. 1, the metal oxide particles (a) 10 have a lamellar structure and the aspect ratio (long diameter/short diameter) calculated from the long diameter 12 and short diameter 13 was greater than 2. The white (light-colored) particles in FIG. 1 are metal oxide particles (b). The metal oxide particles (b) 11 were confirmed to be dispersed in the sintered complex oxide. FIG. 2 is an SEM photograph showing a cross-section of the sintered compact obtained in Comparative Example 2. The white (light-colored) particles in FIG. 2 are metal oxide particles (b). As clearly seen by the shapes of the particles outlined in white in FIG. 2, virtually no metal oxide particles (a) with an aspect ratio of 2 or greater were found.

Figure 3:
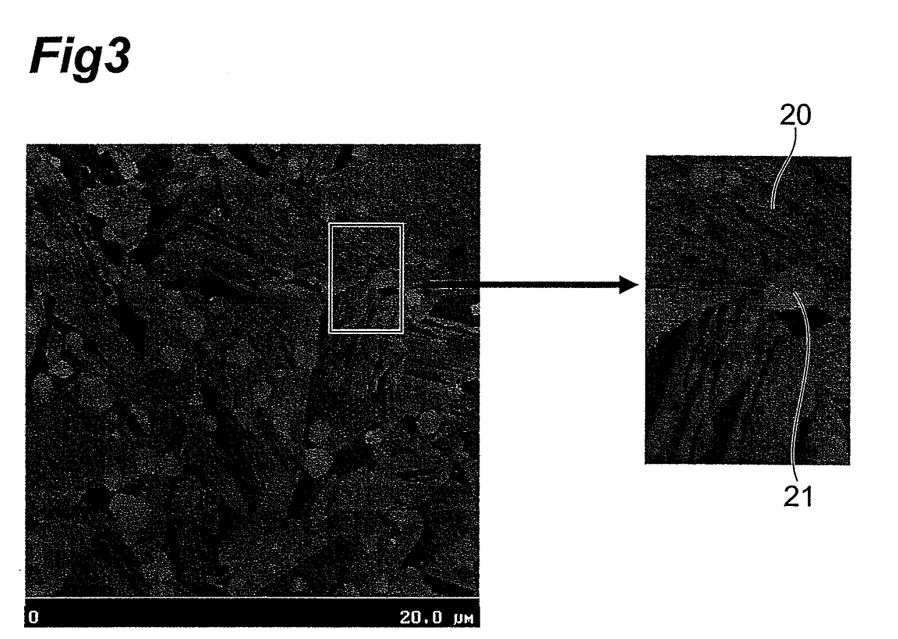
FIG. 3 is an SPM photograph showing a cross-section of the sintered complex oxide of Example 3.
Figure 4:
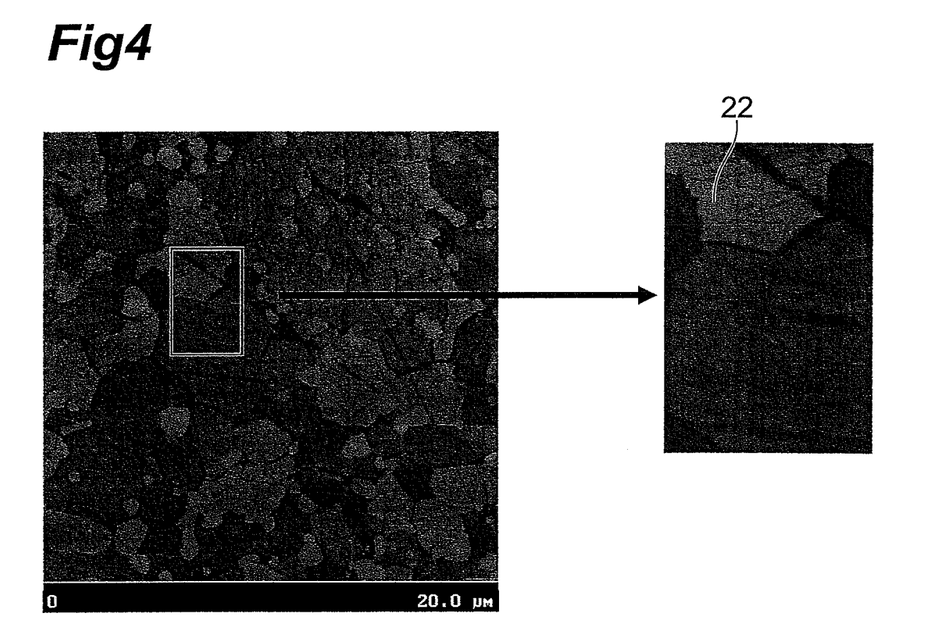
FIG. 4 is an SPM photograph showing a cross-section of the sintered compact obtained in Comparative Example 2.

FIG. 3 is an SPM photograph showing a cross-section of the sintered complex oxide of Example 3. The photograph at the right in FIG. 3 is a magnified view of a partial region of the photograph at the left. In FIG. 3, a lamellar structure was observed inside the metal oxide particles (a) 20. The metal oxide particles (b) 21 were confirmed to be dispersed in the sintered complex oxide. FIG. 4 is an SPM photograph showing a cross-section of the sintered compact obtained in Comparative Example 2. The photograph at the right in FIG. 4 is a magnified view of a partial region of the photograph at the left. No lamellar structure was seen in any of the particles in FIG. 4.

INDUSTRIAL APPLICABILITY

According to the invention there are provided a sintered complex oxide used as a sputtering target that can notably inhibit anomalous discharge during sputtering, a method for producing the sintered complex oxide, a sputtering target comprising the sintered complex oxide and a method for producing a thin film employing the sintered complex oxide.

EXPLANATION OF SYMBOLS

10: Metal oxide particles (a), 11: metal oxide particles (b), 12: long diameter, 13: short diameter, 20: metal oxide particles (a), 21,22: metal oxide particles (b).

The invention claimed is:
1. A sintered complex oxide comprising:
   metal oxide particles (a) having a hexagonal lamellar structure and containing zinc oxide and indium, and

TABLE 2

| | M element | In amount (atomic ratio) | M amount (atomic ratio) | Sintered density (g/cm³) | Relative density (%) | Metal oxide particles (a) | Metal oxide particles (b) | Mean value of long diameter (μm) | Proportion with aspect ratio of ≥2 (%) | Spinel maximum particle size (μm) | Spinel mean particle size (μm) | Discharge property |
|---|---|---|---|---|---|---|---|---|---|---|---|---|
| Example 2 | Al | 0.0025 | 0.02 | 5.46 | 97.0 | A | A | 1.8 | 45 | 0.8 | 0.3 | A' |
| Example 3 | Al | 0.005 | 0.025 | 5.61 | 99.7 | A | A | 6.1 | 62 | 5.3 | 0.7 | A' |
| Example 4 | Al | 0.01 | 0.04 | 5.56 | 99.2 | A | A | 4.2 | 72 | 4.2 | 0.8 | A' |
| Example 5 | Al | 0.003 | 0.02 | 5.61 | 99.6 | A | A | 3.5 | 62 | 8.3 | 0.7 | A' |
| Example 6 | Al | 0.07 | 0.02 | 5.84 | 99.4 | A | A | 4.2 | 66 | 2.1 | 0.5 | A' |
| Example 7 | Al | 0.01 | 0.04 | 4.81 | 89.4 | A | A | 1.0 | 24 | 0.7 | 0.3 | A' |
| Example 8 | Ga | 0.003 | 0.02 | 5.51 | 96.1 | A | A | 3.8 | 58 | 4.2 | 0.5 | A' |
| Comp. Ex. 2 | Al | — | 0.024 | 5.59 | 99.7 | B | A | 3.4 | 8 | 2.3 | 0.5 | C' |
| Comp. Ex. 3 | Al | 0.0025 | 0.02 | 4.48 | 79.6 | B | A | 0.5 | 18 | 0.2 | 0.3 | D' |
| Comp. Ex. 4 | Al | 0.0025 | 0.02 | 5.62 | 99.8 | A | A | 17.3 | 43 | 8.6 | 2.2 | C' |
| Comp. Ex. 5 | Al | 0.006 | 0.02 | 5.62 | 99.6 | A | A | 4.6 | 16 | 3.0 | 0.5 | C' |
| Comp. Ex. 6 | Al | 0.07 | 0.02 | 5.11 | 90.4 | A | A | 3.8 | 14 | 2.2 | 0.3 | D' | metal oxide particles (b) having a spinel structure and containing a metal element M (where M is aluminum and/or gallium), wherein the mean value of the long diameter of the metal oxide particles (a) is no greater than 10 μM, and at least 20% of the entire metal oxide particles (a) have an aspect ratio (long diameter/short diameter) of 2 or greater, based on the number of particles.

2. A sintered complex oxide according to claim 1, wherein the maximum particle size of the metal oxide particles (b) is no greater than 10 μm.

3. A sintered complex oxide according to claim 1, wherein:
the atomic ratio of indium with respect to the total of zinc, indium and the metal element M is 0.001-0.02, and
the atomic ratio of the metal element M with respect to the total is 0.005-0.05.

4. A sintered complex oxide according to claim 1, wherein the metal oxide particles (b) comprise $ZnM_2O_4$ as the major component.

5. A sintered complex oxide according to claim 1, wherein the metal element M is aluminum.

6. A sputtering target comprising a sintered complex oxide according to claim 1.

* * * * *